(12) United States Patent
Huang

(10) Patent No.: US 8,542,483 B2
(45) Date of Patent: Sep. 24, 2013

(54) MEMORY STICK HAVING A LOCK DEVICE

(75) Inventor: Joseph Huang, Taoyuan (TW)

(73) Assignee: HO E Screw & Hardware Co., Ltd., Taoyuan (TW)

( * ) Notice: Subject to any disclaimer, the term of this patent is extended or adjusted under 35 U.S.C. 154(b) by 133 days.

(21) Appl. No.: 13/213,045

(22) Filed: Aug. 18, 2011

(65) Prior Publication Data

US 2013/0044423 A1  Feb. 21, 2013

(51) Int. Cl.
*H05K 7/10* (2006.01)

(52) U.S. Cl.
USPC ............... 361/679.32; 439/131; 361/679.31; 361/740

(58) Field of Classification Search
USPC ........ 361/679.31–679.45; 439/131, 135–147
See application file for complete search history.

(56) References Cited

U.S. PATENT DOCUMENTS

| | | | | |
|---|---|---|---|---|
| 1,276,122 | A | * | 8/1918 | Scheid ........................ 119/866 |
| 5,050,414 | A | * | 9/1991 | Huang ........................ 70/456 R |
| D662,941 | S | * | 7/2012 | Emami ...................... D14/480.3 |
| 8,360,809 | B2 | * | 1/2013 | Chou et al. ............... 439/620.21 |
| 2008/0229794 | A1 | * | 9/2008 | Fujimoto ................... 70/456 R |
| 2008/0261450 | A1 | * | 10/2008 | Nguyen et al. ............... 439/607 |

FOREIGN PATENT DOCUMENTS

| | | | |
|---|---|---|---|
| CN | 201550380 U | * | 8/2010 |
| TW | 098115626 | | 11/2010 |

* cited by examiner

*Primary Examiner* — Anatoly Vortman
*Assistant Examiner* — Jacob Crum
(74) *Attorney, Agent, or Firm* — Guice Patents PLLC

(57) ABSTRACT

A memory stick having a metal housing, a PC board, a tray carrying the PC board, a lock body, and a locking mechanism. The lock body includes a positioning block press-fitted into a top opening of the metal housing and a locating block engaged into a top notch of the metal housing and adapted for accommodating an upper part of the tray and a part of an IC package circuit of the PC board for enabling the USB interface circuit to be suspending in a bottom opening of the metal housing. The locking mechanism enabling the memory stick to be locked to an external object.

7 Claims, 7 Drawing Sheets

MEMORY STICK HAVING A LOCK DEVICE

BACKGROUND OF THE INVENTION

1. Field of the Invention

The present invention relates to a USB memory stick and more particularly, to a memory stick having a lock device, which is electrically connectable to a computer for data access, and facilitates carrying.

2. Description of the Related Art

A USB memory stick is a portable data storage device that is connectable to a computer for data access. As the data storage technology has developed, the storage capacity of typical USB memory sticks has been largely increased. The USB memory sticks are widely used in various fields.

A typical USB memory stick generally comprises a metal shell made of a metal sheet member by stamping, a plastic shell surrounding the metal shell, a PC board accommodated in the metal shell and having a data storage function and an insulative member stopping against the PC board in position. According to this conventional design, the fabrication of the metal shell by means of stamping technology has the advantage of rapid production and low manufacturing cost. However, there is a seam left in the metal shell to obstruct the sense of beauty after fabrication of the metal shell, and therefore the plastic shell is necessary to surround the metal shell and to keep the seam from sight.

Taiwan Patent Application Number 98115626 discloses a USB memory stick entitled "USB memory stick with a seamless metal housing", which comprises a seamless metal housing made of an extruded rectangular metal tube, and an internal structure consisting of a PC board, a metal tray and an insulative upper block and inserted into the seamless metal housing. This design of the USB memory stick eliminates the drawback of the aforesaid conventional USB memory stick.

Further, adding a lock device to a USB memory stick facilitates carrying of the USB memory stick. This is another subject to be discussed in the present invention.

SUMMARY OF THE INVENTION

The main object of the present invention is to provide a memory stick having a lock device, which is equipped with a locking mechanism for easily fastening the memory stick to an object of corded or striped shape stably locking the memory stick to the object and preventing the memory stick from separating from the object to which the locking mechanism is locked. Another object of the present invention to provide a memory stick having a lock device, which facilitates quick assembling of the component parts and no rivet is used.

To achieve these and other objects of the present invention, the memory stick comprises a metal housing, a PC board, a tray, a lock body, a positioning block, a locating block, a locking mechanism, a spring member, and a slide. The metal housing is in the form of a seamless rectangular metal tube, which comprises a top opening and a bottom opening respectively located on opposing top and bottom sides thereof, a top notch transversely located on the top side around the top opening and a longitudinal top sliding slot vertically located on the top side remote from the top notch. The PC Board comprises a USB interface circuit and an IC package circuit having a memory function. The tray is made of a metal sheet member and is attached to the whole back side of the PC board. The lock body has an accommodation recess adapted for accommodating an upper part of the tray and a part of the IC package circuit of the PC board for enabling the USB interface circuit to be suspending in the bottom opening of the metal housing. The positioning block is disposed at the top side of the accommodation recess and press-fitted into the top opening of the metal housing. The locating block is engaged into the top notch of the metal housing and a notch disposed at one lateral side relative to the positioning block. The locking mechanism has a C-shaped shackle extended from the top side of the lock body and suspending above the notch of the lock body. The spring member is mounted in the notch of the lock body and the slide is supported on the spring member in a locking position where the slide closes the shackle. The slide is movable by an external force along the longitudinal top sliding slot of the metal housing from a locked position to an unlocked position where the slide is separated from the shackle. The slide has a press block suspending outside the longitudinal top sliding slot of the metal housing and a stub rod located on a top side thereof for engagement with the free end of the C-shaped shackle.

Further, the C-shaped shackle comprises a rounded recessed portion located on the free end thereof. Further, the slide of the locking mechanism comprises a rounded protrusion raised from the stub rod and adapted for being inserted into the rounded recessed portion of the shackle.

Further, the tray comprises a clip extending from the top side thereof for clamping the PC board, a spring leaf protruding from the clip and pressed on the IC package circuit to hold down the PC board in the tray, and a retaining lug obliquely upwardly extending from the front end of the clip for engagement with the lock body. Further, the lock body comprises a retaining groove disposed in the accommodation recess and adapted for receiving the retaining lug of the tray.

Further, the lock body comprises two side grooves respectively located on two opposite lateral sides thereof. Further, the metal housing comprises two oblique strips respectively engaging into the two side grooves of the lock body.

Further, the tray comprises a pair of ribs adapted for supporting the PC board in the tray at a high elevation.

Further, the top notch of the metal housing can be formed in the back wall of the metal housing and located on the top side of the metal housing. Alternatively, the top notch of the metal housing can be formed in the middle part of opposing front and back walls of the metal housing and located on the top side of the metal housing.

BRIEF DESCRIPTION OF THE DRAWINGS

FIG. 1A is an enlarged view of part A of FIG. 1.

FIG. 1B is an oblique rear elevational view of the PC board and the tray shown in FIG. 1A.

DETAILED DESCRIPTION OF THE PREFERRED EMBODIMENT

Figure 1:
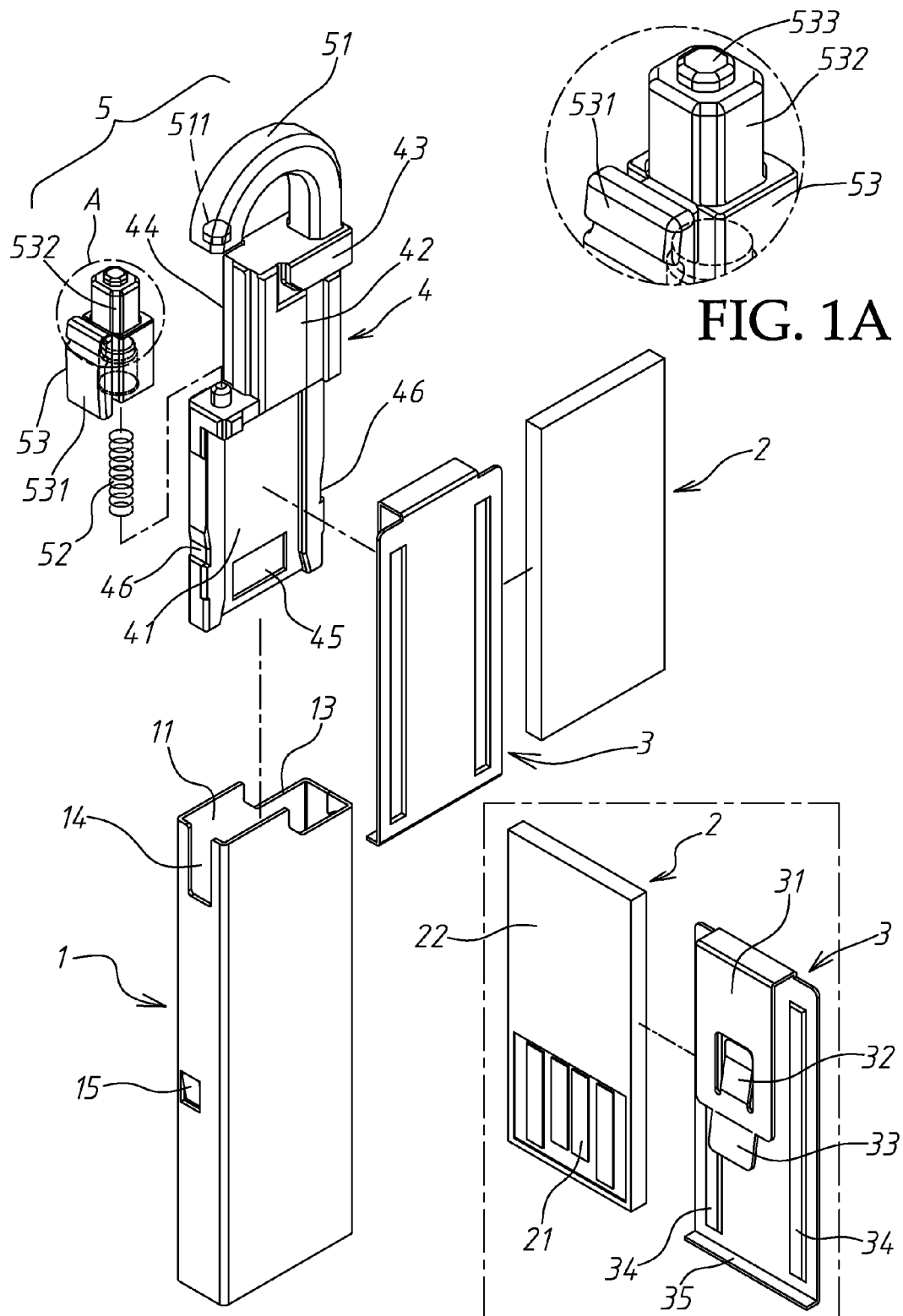
FIG. 1 is an exploded view of a memory stick in accordance with the present invention.
Figure 2:
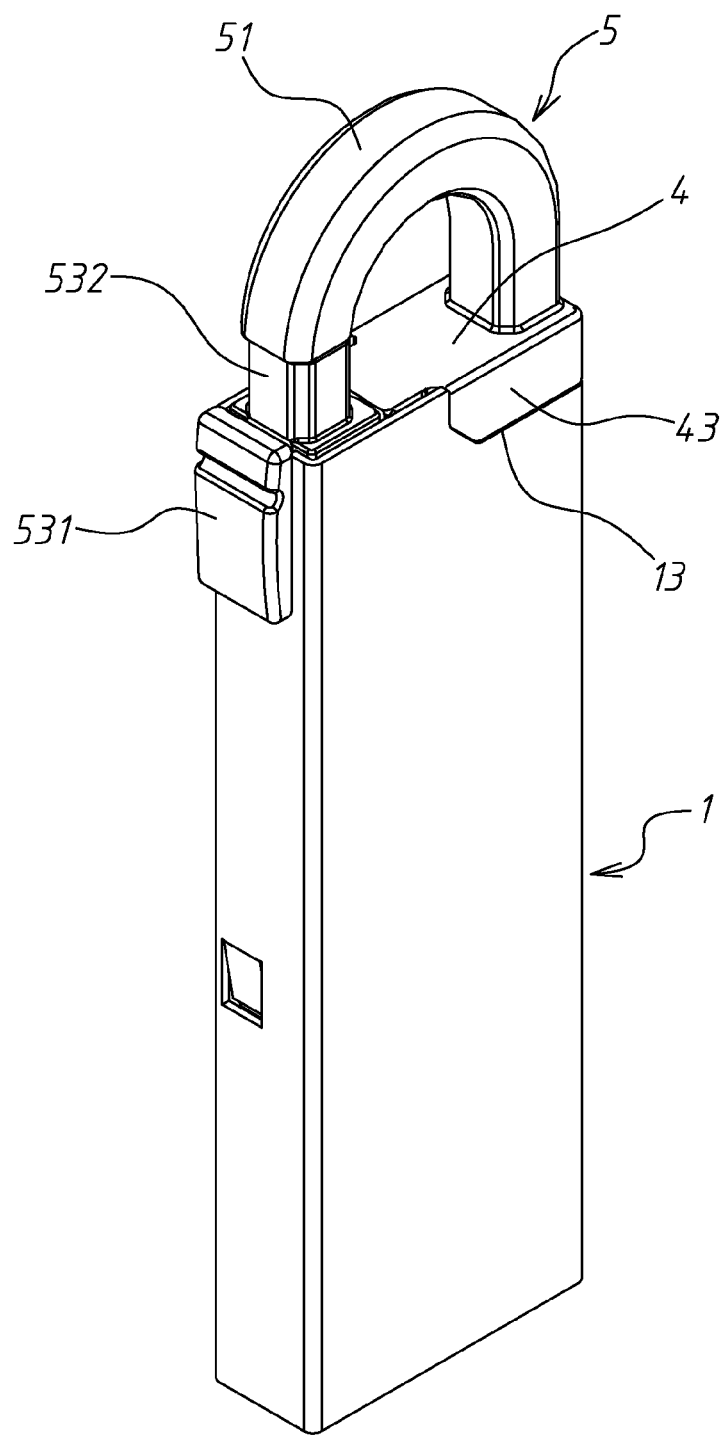
FIG. 2 is an elevational view of the memory stick in accordance with the present invention.

Referring to FIGS. 1 and 2, a memory stick in accordance with the present invention is shown comprising a metal housing 1, a PC board 2, a tray 3, a lock body 4 and a locking mechanism 5.

The metal housing 1 is a seamless rectangular metal tube, comprising a top opening 11 and a bottom opening 12 respectively located on the opposing top and bottom sides thereof, a top notch 13 transversely located on the top side around the top opening 11, a longitudinal top sliding slot 14 vertically located on the top side and spaced apart from the top notch 13, and two oblique strips 15 respectively extended from the two opposite lateral sides of the metal housing 1.

The PC board 2 comprises a USB interface circuit 21 and an IC package circuit 22 with memory function, as shown in FIG. 1B.

The tray 3 is made of a metal sheet member by stamping and attached to the whole back side of the PC board 2. The tray 3 comprises a clip 31 extending from the top side thereof over the front side of the PC board 2, as shown in FIG. 1B, a spring leaf 32 protruding from the clip 31 and pressing on the surface of the IC package circuit 22 to hold down the PC board 2 in the tray 3, a retaining lug 33 obliquely upwardly extending from the front end of the clip 31 for engagement with the lock body 4, a pair of ribs 34 for supporting the PC board 2 in the tray 3 at a high elevation to facilitate quick heat dissipation and positive electric contact upon insertion of the memory stick into a USB port, and an end flange 35 perpendicularly disposed at the bottom side thereof and spaced apart from the clip 31 for stopping the PC board 2 in the tray 3 to keep the USB interface circuit 21 in alignment with the bottom opening 12 of the metal housing 1 and to prevent the PC board 2 from falling out of the tray 3, as shown in FIG. 4.

Figures 3, 4:
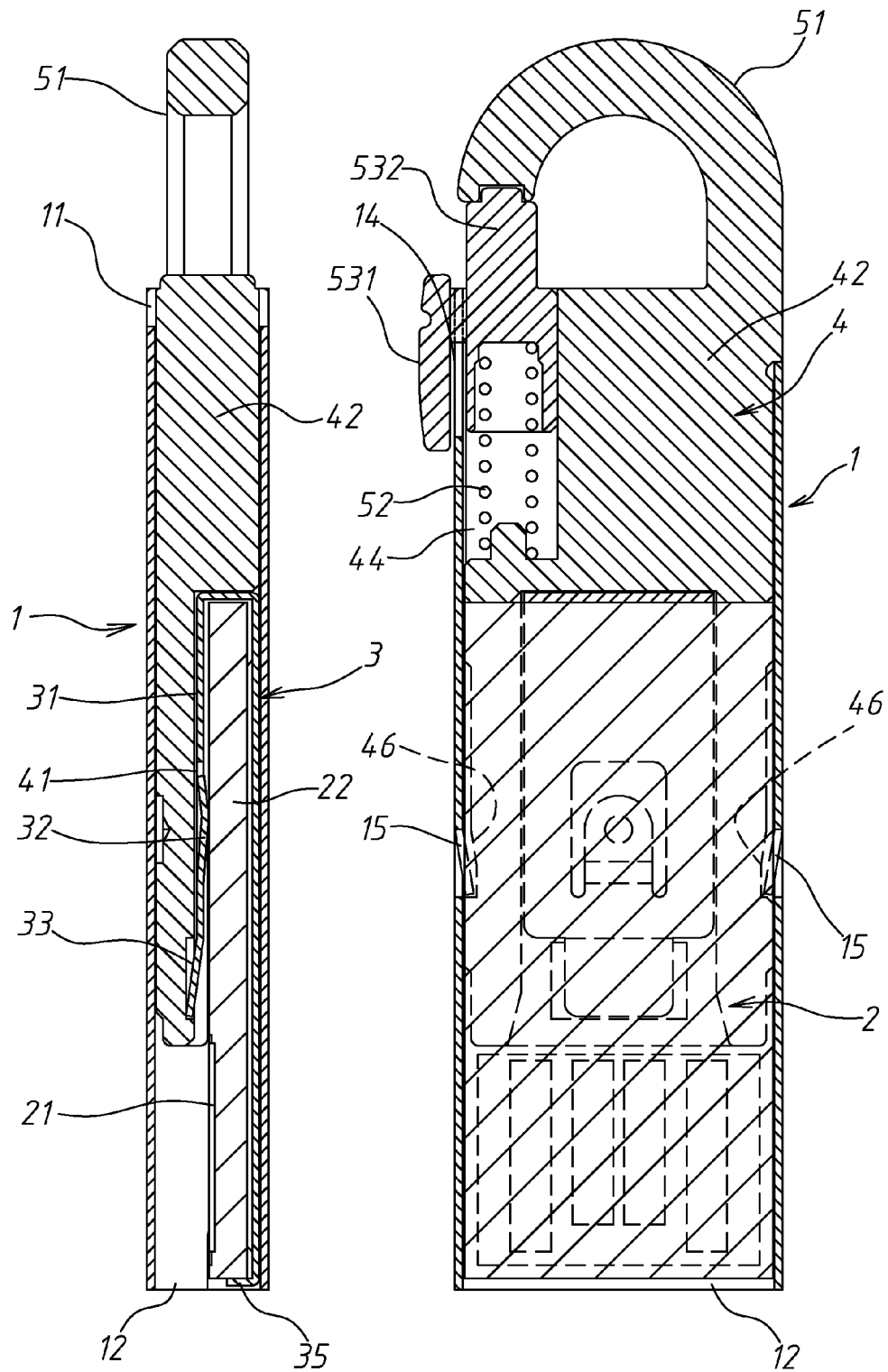
FIG. 3 is a sectional front view of the memory stick in accordance with the present invention.
FIG. 4 is a sectional side view of the memory stick in accordance with the present invention.

The lock body 4 comprises an accommodation recess 41 adapted for accommodating the upper part of the tray 3 and a part of the IC package circuit 22 of the PC board 2 and for working as a track during installation so that the surface of the USB interface circuit 21 can suspend in the bottom opening 12 of the metal housing 1, as shown in FIGS. 3 and 4, a positioning block 42 disposed at the top side of the accommodation recess 41 and press-fitted into the top opening 11 of the metal housing 1 to enhance installation stability, a locating block 43 located in the top notch 13 of the metal housing 1 to avoid vibration upon insertion of the bottom opening 12 of the metal housing 1 into a USB socket, as shown in FIG. 2, a notch 44 disposed at one lateral side relative to the positioning block 42, a retaining groove 45 disposed in the accommodation recess 41 for receiving the retaining lug 33 of the tray 3, as shown in FIG. 4, and two side grooves 46 respectively located on two opposite lateral sides thereof for receiving the oblique strips 15 of the metal housing 1 respectively to enhance connection stability between the lock body 4 and the metal housing 1, as shown in FIG. 3.

Figure 5:
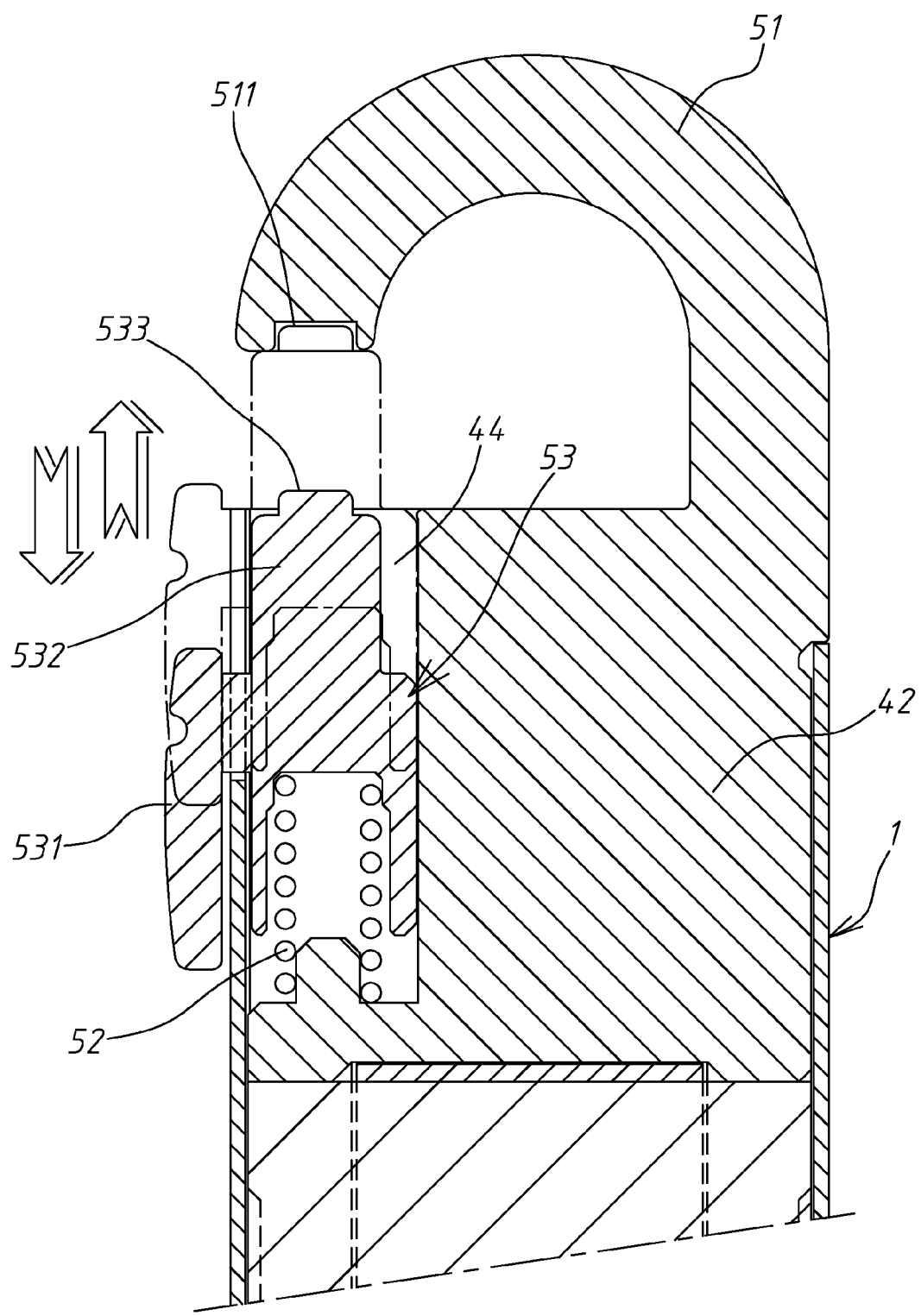
FIG. 5 is a schematic drawing of the present invention, illustrating the moving direction of the slide of the locking mechanism.

The locking mechanism 5 comprises a C-shaped shackle 51, a spring member 52 and a slide 53. The C-shaped shackle 51 extends from the top side of the lock body 4 to the top side of the notch 44 of the lock body 4. The spring member 52 supports the slide 53 in the notch 44, allowing movement of the slide 53 along the longitudinal top sliding slot 14. The slide 53 provides the locking and unlocking actions of the locking mechanism 5, comprising a press block 531 suspending outside the longitudinal top sliding slot 14 of the metal housing 1 and a stub rod 532 located on the top side thereof for engagement with the free end of the C-shaped shackle 51. As shown in FIG. 5, the spring member 52 supports the slide 53 in the top side of the notch 44 of the lock body 4, as indicated by the imaginary line, pressing the stub rod 532 out of the top opening 11 of the metal housing 1 to engage the free end of the shackle 51. When the press block 531 is pressed downwards to the solid line shown in FIG. 5, the stub rod 532 is moved backwardly (downwardly) away from the free end of the C-shaped shackle 51 to a position below the top opening 11 of the metal housing 1 and the slide 53 is lowered to compress the spring member 52, and therefore the locking mechanism 5 is unlocked. Further the C-shaped shackle 51 comprises a rounded recessed portion 511 located on the free end thereof. Further, the stub rod 532 comprises a rounded protrusion 533, which is inserted into the rounded recessed portion 511 when the locking mechanism 5 is locked, enhancing locking stability.

Figure 6:
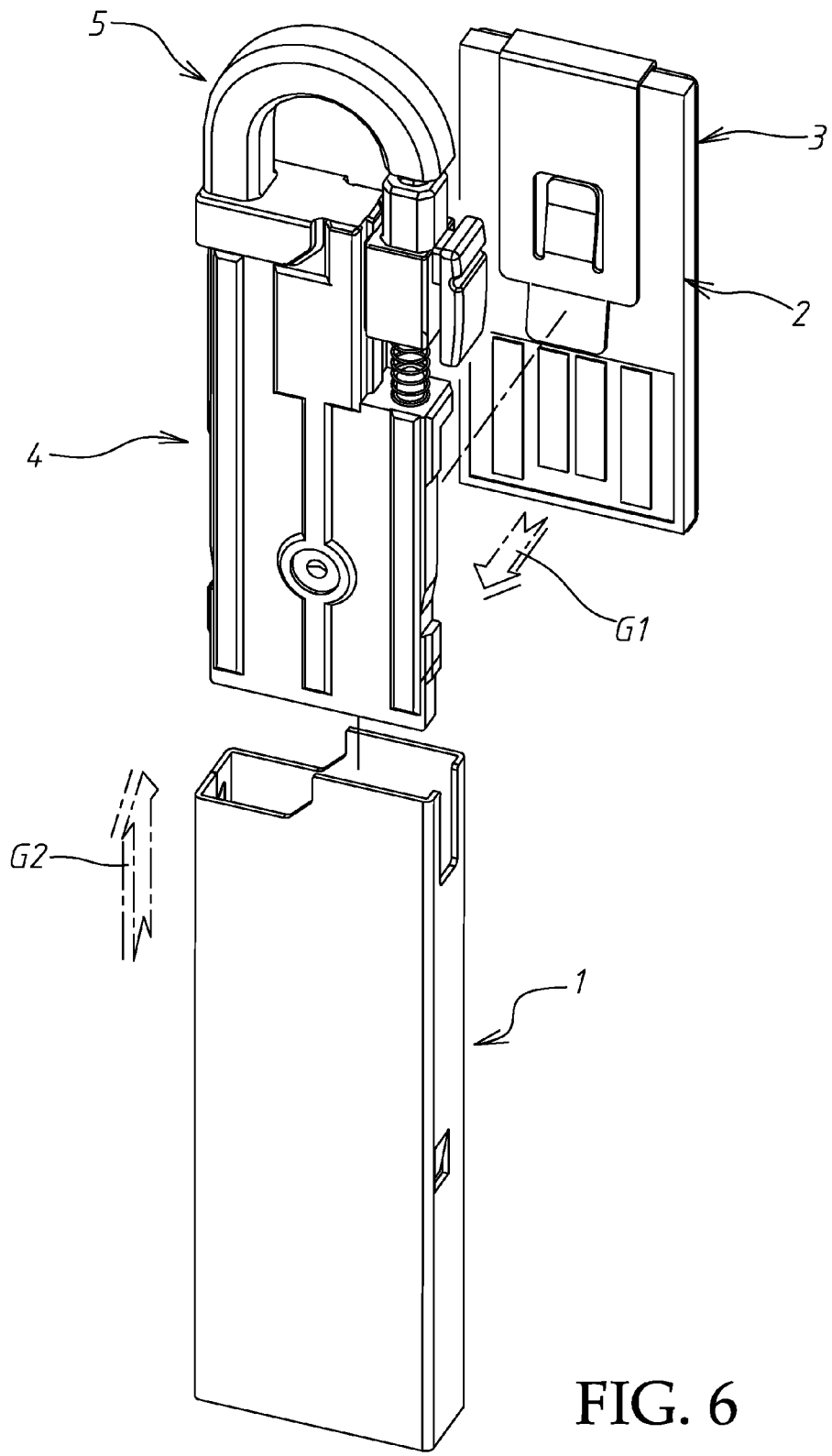
FIG. 6 is a schematic drawing illustrating the assembly operation of the memory stick in accordance with the present invention.

During the assembly process, as shown in FIG. 6, the PC board 2 is inserted into the tray 3, and then the tray 3 is inserted into the accommodation recess 41 of the lock body 4 in the direction as indicated by the arrowhead sign G1, and then position the metal housing 1 around the PC board 2, the tray 3 and the lock body 4 by moving the metal housing 1 in the direction as indicated by the arrowhead sign G2, and forming the configuration as indicated in FIG. 2. When replacing the PC board 2, disengage the oblique strips 15 of the metal housing 1 from the two side grooves 46 of the lock body 4, and then remove the PC board 2, the tray 3 and the lock body 4 from the metal housing 1 for replacement of the PC board 2.

It is to be noted that the design of full space engagement between the top notch 13 of the metal housing 1 and the locating block 43 of the lock body 4 avoids vibration of component parts of the memory stick upon insertion of the bottom opening 12 of the metal housing 1 into a USB socket, assuring positive contact between the USB interface circuit 21 and the internal circuit of the USB socket for positive signal transmission.

Figure 7:
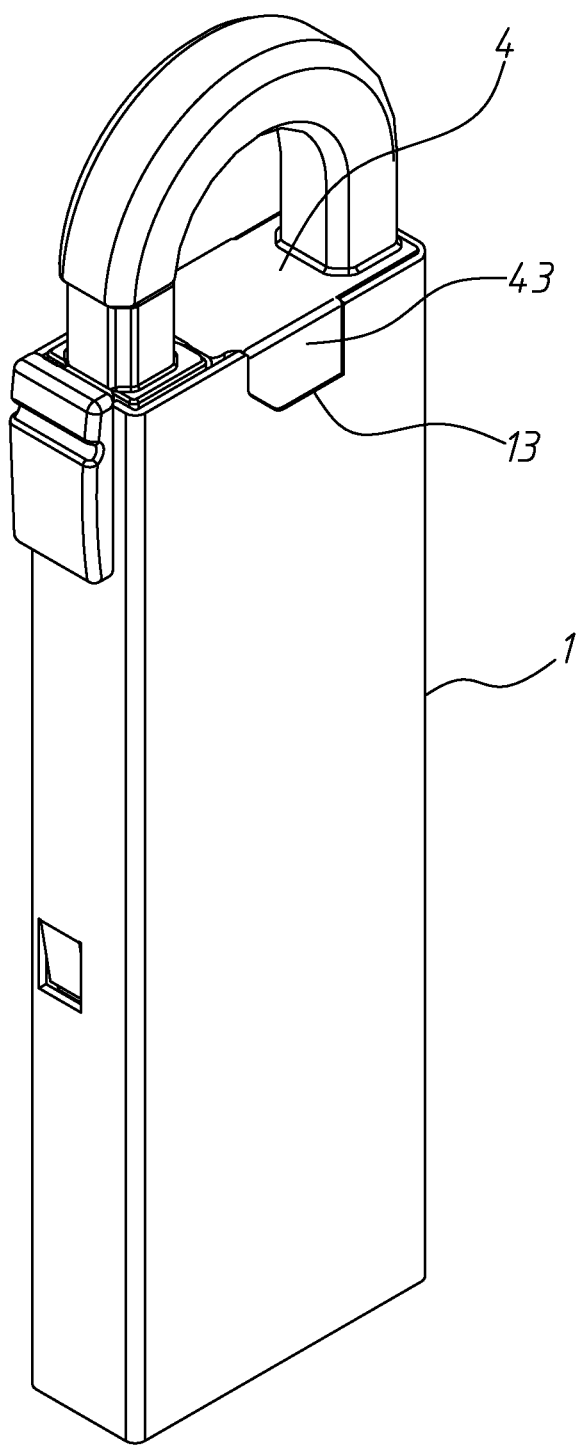
FIG. 7 is elevational view of an alternate form of the memory stick in accordance with the present invention.

In FIGS. 1 and 2, the top notch 13 of the metal housing 1 is located on the back wall of the metal housing 1. Alternatively, as shown in FIG. 7, the top notch 13 is located on the middle of the front and back walls of the metal housing 1 at the top, and the locating block 43 of the lock body 4 is also located on the middle for positive engagement with the top notch 13.

Further, the design of the rounded protrusion 533 of the stub rod 532 of the slide 53 of the locking mechanism 5 for engagement with the rounded recessed portion 511 of the C-shaped shackle 51 assures a high level of locking stability. Thus, when the locking mechanism 5 is fastened to a thin object, the thin object will not separate from the memory stick.

In conclusion, the invention provides a USB memory stick having a lock device, which has the advantages as follows:

1. The memory stick is equipped with a locking mechanism for fastening to a cord-like or strip-like object.

2. When the shackle of the locking mechanism is closed by the slide, the rounded protrusion of the stub rod of the slide is engaged into the rounded recessed portion of the shackle, assuring a high level of locking stability and avoiding falling of the memory stick from the object to which the locking mechanism is locked.

3. The spring leaf engagement design facilitates quick assembling of the component parts without riveting.

Figure 8:
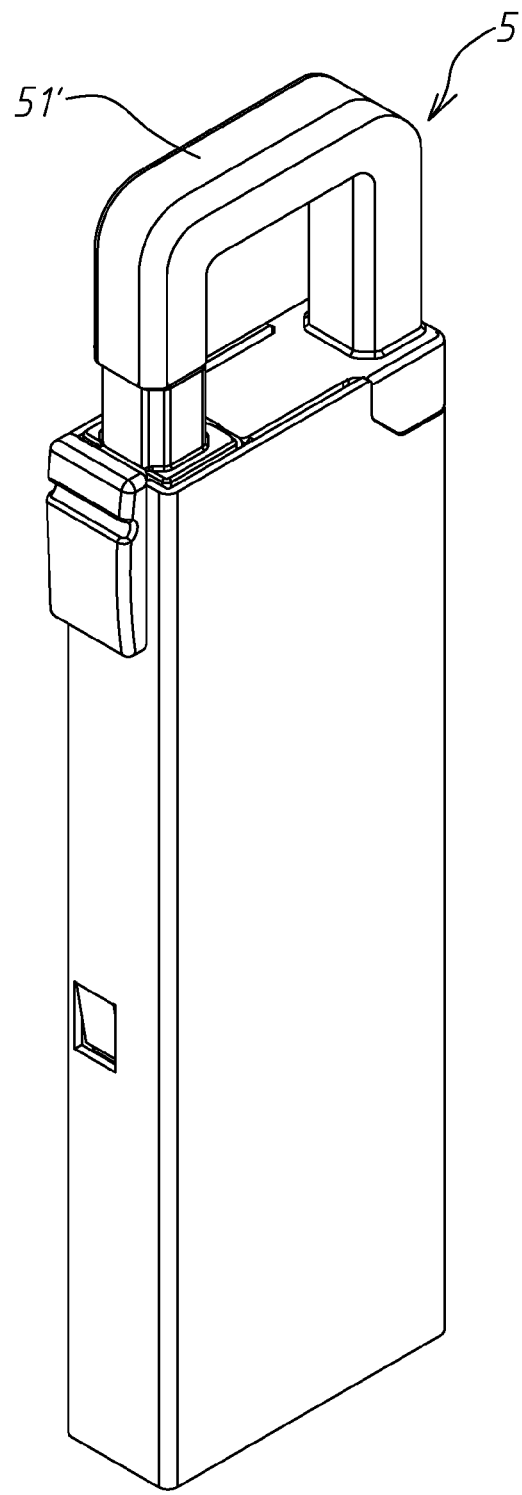
FIG. 8 is elevational view of another alternate form of the memory stick in accordance with the present invention.

Further, as shown in FIG. 8, a rectangular shackle 51' may be used to substitute for the aforesaid C-shaped shackle 51.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A memory stick, comprising:

a metal housing in the form of a seamless rectangular metal tube, said metal housing comprising a top opening and a bottom opening respectively located on opposing top and bottom ends thereof, a top notch formed on the top end in edges of said top opening of the metal housing and a longitudinal top sliding slot vertically located on the top end in a single edge of top opening and spaced apart from said top notch;

a PC board comprising a USB interface circuit and an IC package circuit having a memory function;

a tray made of a metal sheet member and attached to the whole back side of said PC board;

a lock body comprising an accommodation recess adapted for accommodating an upper part of said tray and a part of said IC package circuit of said PC board for enabling said USB interface circuit to be suspending in the bottom opening of said metal housing, a positioning block located above a top of said accommodation recess and having a bottom wall connected to the accommodating recess and press-fitted into the top opening of said metal housing, a locating block inserted into the top notch of said metal housing, and a notch located on one lateral side of said positioning block;

a locking mechanism comprising a C-shaped shackle extended from a top of said lock body and suspending above the notch of said lock body, a spring member mounted in the notch of said lock body, and a slide supported on said spring member and being movable between a locked position and an unlocked position in said longitudinal top sliding slot of said metal housing, when the slide is located in the locked position, said slide engages said shackle, and when the slide is located in the unlocked position, said slide is moved along the longitudinal top sliding slot of said metal housing from said locking position to said unlocked position where said slide is spaced apart from said shackle, said slide comprising a press block suspending outside the longitudinal top sliding slot of said metal housing and a stub rod located on a top thereof for engaging with the free end of said C-shaped shackle when the slide is located in the locked position.

2. The memory stick as claimed in claim 1, wherein said C-shaped shackle comprises a rounded recessed portion located on the free end thereof; said slide of said locking mechanism comprises a rounded protrusion raised from said stub rod and adapted for engaging into the rounded recessed portion of said shackle.

3. The memory stick as claimed in claim 1, wherein said tray further comprises a clip extending from a top side thereof for clamping said PC board, a spring leaf protruded from said clip and pressing against said IC package circuit and securing said PC board in said tray, and a retaining lug obliquely upwardly extended from a front of said clip for engagement with the lock body; said lock body comprises a retaining groove disposed in said accommodation recess and adapted for receiving said retaining lug of said tray.

4. The memory stick as claimed in claim 1, wherein said lock body further comprises two side grooves respectively located on two opposite lateral sides thereof; said metal housing further comprises two oblique strips respectively engaged into the two side grooves of said lock body.

5. The memory stick as claimed in claim 1, wherein said tray further comprises a pair of ribs adapted for supporting said PC board in said tray at a high elevation.

6. The memory stick as claimed in claim 1, wherein said top notch of said metal housing is formed in a back wall of said metal housing and located on the top end of said metal housing.

7. The memory stick as claimed in claim 1, wherein said top notch of said metal housing is formed in a middle part of opposing front and back walls of said metal housing and located on the top side of said metal housing.

* * * * *